US009754763B2

(12) United States Patent
Oyagi et al.

(10) Patent No.: US 9,754,763 B2
(45) Date of Patent: Sep. 5, 2017

(54) ELECTRON MICROSCOPE

(71) Applicant: Hitachi High-Technologies Corporation, Minato-ku, Tokyo (JP)

(72) Inventors: Toshiyuki Oyagi, Tokyo (JP); Takafumi Yotsuji, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/912,549

(22) PCT Filed: Mar. 14, 2014

(86) PCT No.: PCT/JP2014/056823
§ 371 (c)(1),
(2) Date: Feb. 17, 2016

(87) PCT Pub. No.: WO2015/045443
PCT Pub. Date: Apr. 2, 2015

(65) Prior Publication Data
US 2016/0203943 A1    Jul. 14, 2016

(30) Foreign Application Priority Data

Sep. 26, 2013   (JP) ................................. 2013-199129

(51) Int. Cl.
*H01J 37/26*   (2006.01)
*H01J 37/22*   (2006.01)
(Continued)

(52) U.S. Cl.
CPC ............ *H01J 37/222* (2013.01); *H01J 37/22* (2013.01); *H01J 37/244* (2013.01); *H01J 37/26* (2013.01);
(Continued)

(58) Field of Classification Search
CPC ........ H01J 37/26; H01J 37/261; H01J 37/263; H01J 37/268; H01J 37/28; H01J 37/222; H01J 37/285; H01J 2237/006
(Continued)

(56) References Cited

U.S. PATENT DOCUMENTS

2008/0035843 A1   2/2008   Hatano et al.
2008/0067374 A1*  3/2008   Ono ..................... G01R 31/307
                                                            250/310
(Continued)

FOREIGN PATENT DOCUMENTS

DE   11 2012 001 214 T5   1/2014
JP        5-325859 A      12/1993
(Continued)

OTHER PUBLICATIONS

International Search Report (PCT/ISA/210) issued in PCT Application No. PCT/JP2014/056823 dated Apr. 22, 2014 with English translation (six pages).
(Continued)

*Primary Examiner* — Nicole Ippolito
(74) *Attorney, Agent, or Firm* — Crowell & Moring LLP

(57) ABSTRACT

Provided is an electron microscope wherein a detector requiring the application of a voltage is used to obtain a micrograph from a sample placed in a gas atmosphere. The electron microscope is provided with a gas inlet device for emitting gas onto a sample, and a gas control device controlling the amount of gas emitted by the gas inlet device so that, during the gas emission by the gas inlet device, the degree of vacuum within the space where the detector (49-51, 55) is installed is continuously maintained to less than a set value.

5 Claims, 11 Drawing Sheets

(51) Int. Cl.
  *H01J 37/285* (2006.01)
  *H01J 37/244* (2006.01)
  *H01J 37/28* (2006.01)

(52) U.S. Cl.
  CPC ............ *H01J 37/28* (2013.01); *H01J 37/285* (2013.01); *H01J 2237/006* (2013.01)

(58) Field of Classification Search
  USPC .................. 250/305, 306, 307, 310, 311
  See application file for complete search history.

(56) References Cited

U.S. PATENT DOCUMENTS

| 2011/0139986 A1 | 6/2011 | Ohta | |
| 2011/0303845 A1 | 12/2011 | Yaguchi et al. | |
| 2012/0091337 A1* | 4/2012 | Bean | H01J 37/18 250/307 |
| 2014/0021347 A1 | 1/2014 | Ominami et al. | |
| 2016/0064183 A1* | 3/2016 | Nagaoki | H01J 37/16 250/307 |

FOREIGN PATENT DOCUMENTS

| JP | 2002-100316 A | 4/2002 |
| JP | 2003-187735 A | 7/2003 |
| JP | 2005-190864 A | 7/2005 |
| JP | 2008-47310 A | 2/2008 |
| JP | 2011-3426 A | 1/2011 |
| JP | 2011-154921 A | 8/2011 |

OTHER PUBLICATIONS

Japanese-language Written Opinion (PCT/ISA/237) issued in PCT Application No. PCT/JP2014/056823 dated Apr. 22, 2014 (four pages).

Japanese-language International Preliminary Report on Patentability (PCT/IPEA/409) issued in PCT Application No. PCT/JP2014/056823 dated Sep. 24, 2014 (four pages).

German Office Action issued in counterpart German Application No. 11 2014 003 791.5 dated Aug. 18, 2016 with English translation (11 pages).

* cited by examiner

EXAMPLE OF CAPTURING MOVING IMAGE

EXAMPLE OF TRACE FUNCTION (SHAPE TRACKING)

TRACING EXAMPLE

MEASUREMENT OF AREA, PERIMETER, ETC.

EXAMPLE OF FIELD ALIGNMENT

EXAMPLE OF AUTOMATIC GAS INTRODUCTION AMOUNT CONTROL

ELECTRON MICROSCOPE

TECHNICAL FIELD

The present invention relates to an electron microscope.

BACKGROUND ART

In sample observation using an electron microscope, a so-called in-situ observation is sometimes performed for dynamically observing in situ a process of reaction between a sample in a gaseous atmosphere and the gas. With regard to a fuel cell catalyst, for example, exposure of the catalyst to the gas induces migration of noble metal particles on a carrier, resulting in the growth of noble metal particles. A degradation analysis of the catalyst is made by observing in situ the growth of the particles.

This type of observation dictates the need for dividing a primary space in a lens barrel maintained in a high vacuum state from a space in the vicinity of a sample which is maintained in a low vacuum state with a gas. The dividing method is broadly classified into a partition wall type and a differential exhaust type. As a technique related to the former method, Japanese Unexamined Patent Application Publication No. 2003-187735 discloses a sample holder which hermetically seals a sample in a gaseous atmosphere. This sample holder includes: a sample placement portion formed with an opening for allowing the passage of an electron beam; a heating wire (sample heater) so extended as to intersect the opening; a partition wall for isolating the sample placement portion from the interior of a sample chamber (vacuum); and a gas inlet tube (gas inlet device) for introducing a gas into a sample placement space defined by the partition wall.

CITATION LIST

Patent Literature

Patent Literature 1: Japanese Unexamined Patent Application Publication No. 2003-187735

SUMMARY OF INVENTION

Technical Problem

Moving images are taken during the in-situ observation of a sample placed in the above-described gaseous atmosphere and in the low vacuum state. In the event of a sample drift or change in the sample shape due to the reaction, an operator needs to record the images after making manual correction.

Further, voltage and inlet gas are manually controlled. Therefore, data collection requires operations by a plurality of operators, so that some operation mistake by an operator would sometimes develop reaction excessively.

It is an object of the present invention to provide an electron microscope that can provide a microscopic image of a sample placed in the gaseous atmosphere by providing a control to correct the sample drift caused by reaction.

Solution to Problem

According to the present invention for achieving the above object, an electron microscope includes: a detector for detecting an electron occurring under the irradiation of a sample with an electron beam from an electron gun; a display device for displaying a microscopic image of the sample based on an output from the detector; a device for measuring sample drift based on the image; a device for controlling gas introduction; a gas inlet device for emitting a gas onto the sample; and a gas control unit for controlling the amount of gas emitted by the gas inlet device in a manner to ensure that the degree of vacuum in a space installed with the detector is continuously maintained at less than a set value during the gas emission by the gas inlet device.

Advantageous Effect of Invention

The invention provides moving image observation by reducing sample drift in the in-situ observation of a sample in the gaseous atmosphere.

DESCRIPTION OF EMBODIMENTS

An embodiment of the present invention will hereinbelow be described with reference to the accompanying drawings.

While the following description is made by way of example of a scanning transmission electron microscope (STEM), it is to be noted that the present invention is applicable not only to electron microscopes including scanning electron microscopes (SEMs) transmission electron microscopes (TEMs) and scanning transmission electron microscopes but also to charged particle beam apparatuses.

Figure 1:
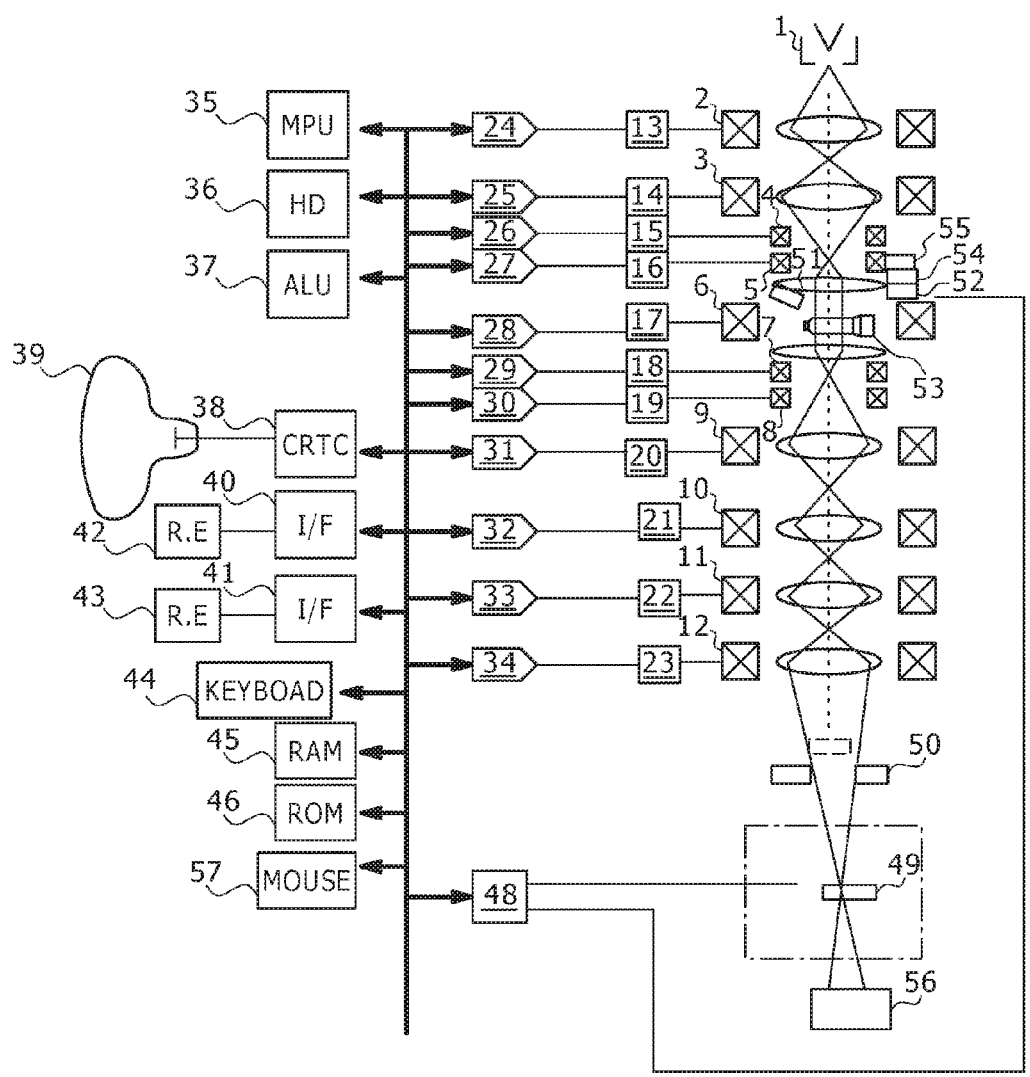
FIG. 1 is a schematic block diagram showing a scanning transmission electron microscope according to an embodiment of the present invention.

FIG. 1 is a schematic block diagram showing a scanning transmission electron microscope according to an embodiment of the present invention. The electron microscope shown in this figure includes: an electron gun 1; first and second illumination lens coils 2, 3; first and second polarization coils (scanning coils) 4,5; an objective lens coil 6; first and second electromagnetic sample image moving coils 7, 8; first and second intermediate lens coils 9, 10; first and second projection lens coils 11, 12; excitation power supplies 13 to 23; digital-analog converters (DAC) 24 to 34; a microprocessor (MPU) 35; a hard disk drive (HDD) 36; an arithmetic logical unit (ALU)) 37; a monitor controller (CRT controller) 38; a monitor (CRT) 39; interfaces (I/F) 40, 41; a magnification switching rotary encoder (RE) 42; an input rotary encoder (RE) 43; a keyboard 44; a mouse 57; a RAM 45; a ROM 46; and an image capture interface 48. A sample holder 53 for retaining a sample 70 is disposed at an optical axis (see FIG. 3). The objective lens coil 6 shown in the figure is a strongly excited lens (see FIG. 4) which includes lenses formed above and below the sample.

Figure 2:
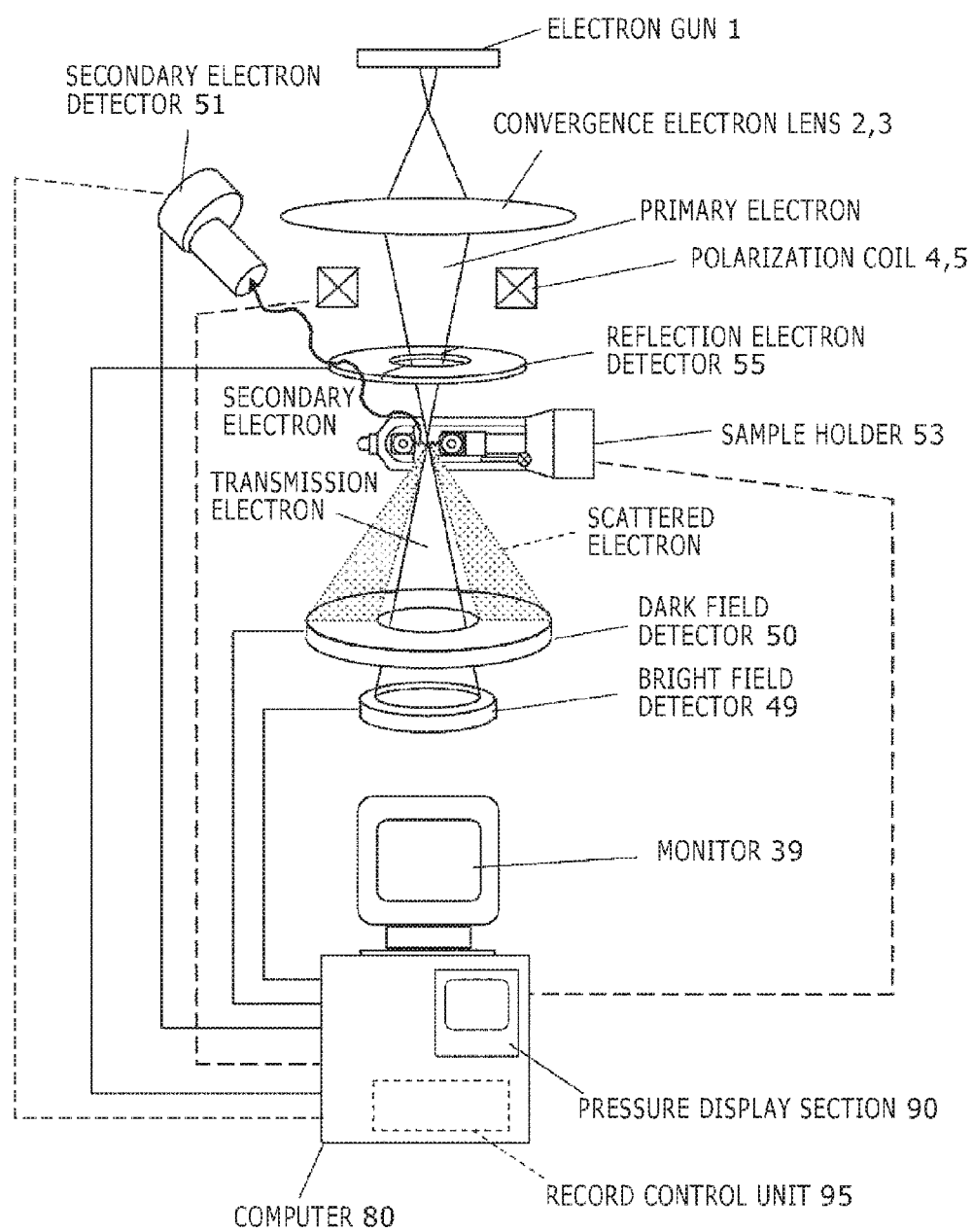
FIG. 2 is a diagram showing a transmission scanning electron microscope section of electron microscope instrumentation according to an embodiment of the present invention, the electron microscope section used for obtaining a scanning transmission image.

FIG. 2 shows an inventive main part of electron microscope instrumentation according to the embodiment of the present invention. Referring to the figure, an electron microscope section according to the embodiment includes: the electron gun 1; a convergence lens formed of the illumination lens coils 2, 3; the polarization coils (scanning coils) 4, 5 as a scanning device for scanning an electron beam generated by the electron gun 1 on the sample 70 (see FIG. 3); the sample holder 53 retaining the sample 70; detectors for detecting an electron occurring under the irradiation of the sample 70 with the electron beam from the electron gun 1 (secondary electron detector 51, reflection electron detector 55, dark field image detector 50 and bright field image detector 49); a computer 80; a monitor 39 for displaying a microscopic image of the sample 70 based on the outputs from the detectors 51, 55, 50, 49; and a pressure display section 90 displaying vacuum degrees of individual portions in the microscope body. The computer 80 is mounted with a part of the hardware shown in FIG. 1 that includes the microprocessor 35, the HDD 36, the monitor controller 38, the RAM 45, the ROM 46, the image capture interface 48 and the like; a record control unit 95 and the like.

Figure 3:
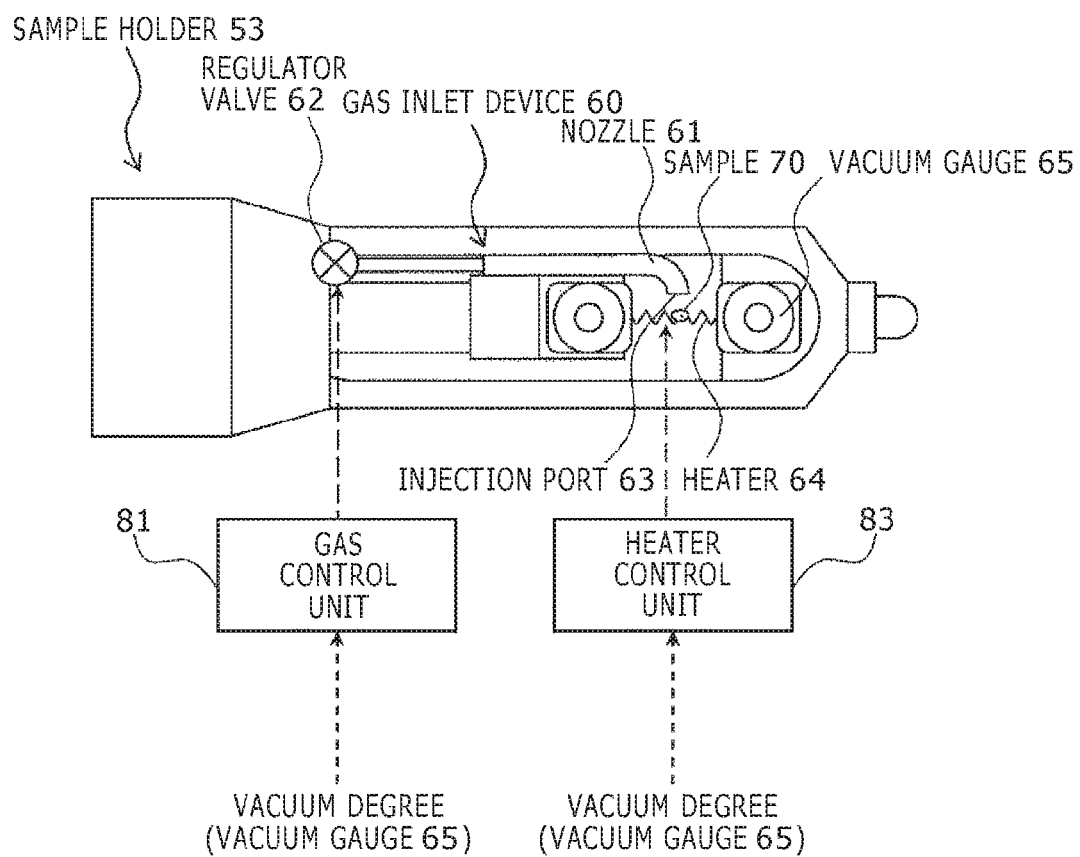
FIG. 3 is a schematic diagram showing a structure of a sample holder 53 according to the embodiment of the present invention.

FIG. 3 is a schematic diagram showing a structure of the sample holder 53 according to the embodiment of the present invention. As shown in the figure, the sample holder 53 includes: a heater (heating element) 64; vacuum gauges 65 and a gas inlet device 60.

The heater 64 is composed of a wire bridged across a pair of leads connected to a power supply (not shown). The sample 70 is attached to and retained by the wire. Namely, the heater 64 also functions as a sample retaining portion. The heater 64 is equipped with a temperature sensor so as to be capable of detecting the temperature of the sample 70. An output (sample temperature) from the temperature sensor is supplied to the computer 80 and is displayed on the monitor 39 as needed. An output from the heater 64 is controlled based on a control signal outputted to the heater 64 from a heater control unit 83 mounted in the computer 80.

The vacuum gauge 65 is for detecting the degree of vacuum (pressure) in the vicinity of the sample 70 and installed in the sample holder 53. According to the illustrated example, the vacuum gauge 65 is mounted in the sample holder 53 in a manner to be positioned within 1 mm from the sample 70. However, the vacuum gauge may also be disposed independently from the sample holder 53. An output (a pressure in the vicinity of the sample 70) from the vacuum gauge 65 is supplied to the computer 80, so as to be displayed on the pressure display section 90 (see FIG. 2) or to be used for gas emission control (to be described hereinafter) by the gas inlet device 60.

Figure 4:
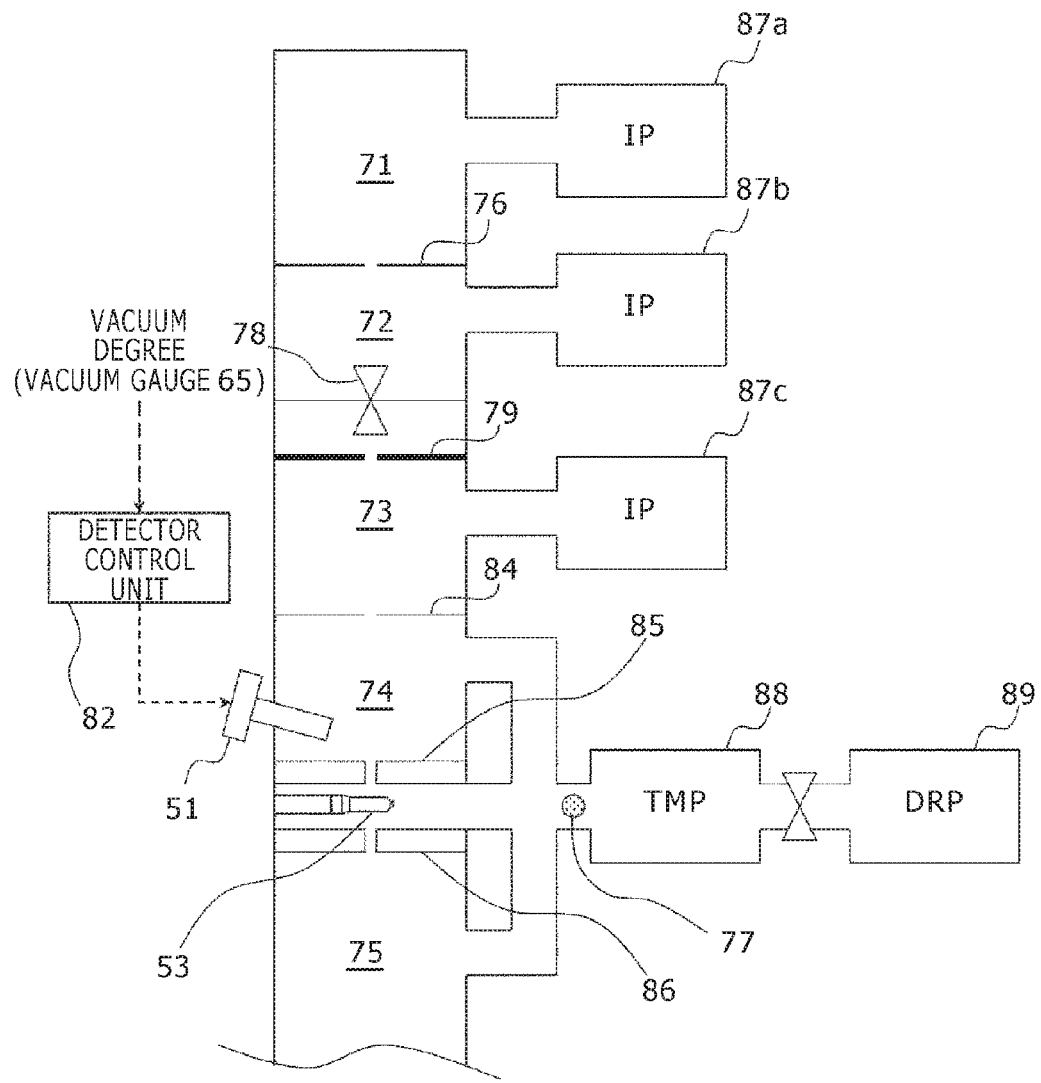
FIG. 4 is a schematic diagram showing chambers disposed in the body of the electron microscope according to the embodiment of the present invention.

FIG. 4 is a schematic diagram showing chambers disposed in the body of the electron microscope according to the embodiment of the present invention. The inside of the body of the electron microscope according to the embodiment is divided into an electron gun chamber 71, a first intermediate chamber 72, a second intermediate chamber 73, a third intermediate chamber 74 and a sample chamber 75. A partition wall dividing the electron gun chamber 71 from the first intermediate chamber 72 is provided with a first orifice 76. A partition wall dividing the first intermediate chamber 72 from the second intermediate chamber 73 is provided with a gun valve 78. A partition wall disposed in the second intermediate chamber is provided with a second orifice 79. A partition wall dividing the second intermediate chamber 74 from the third intermediate chamber 75 is provided with a third orifice 84. The third intermediate chamber 75 and the sample chamber 76 are divided by an upper magnetic pole 85 of the objective lens. In the sample chamber 76, the sample holder 53 is disposed between the upper magnetic pole 85 and a lower magnetic pole 86 of the objective lens.

The electron gun chamber 71 is connected with a vacuum pump (ion pump) 87a. The first intermediate chamber 72 is connected with a vacuum pump (ion pump) 87b. The second intermediate chamber 73 is connected with a vacuum pump (ion pump) 87c. The third intermediate chamber 74, a space defined between the upper magnetic pole 85 and the lower magnetic pole 86, and a space downward from the lower magnetic pole 87 are connected with the same vacuum pumps (turbo-molecular pump 88 and dry pump 89) via independent passages.

In the third intermediate chamber 74, the secondary electron detector 51 is disposed to which a predetermined voltage (extraction voltage) is applied for detection of a secondary electron generated by radiation of the electron beam from the electron gun 1. The voltage application to the secondary electron detector 51 is control led based on a control signal outputted to the secondary electron detector 51 from a detector control unit 82 installed in the computer 80. An inlet of the turbo-molecular pump 88 is provided with a vacuum gauge 77, which outputs a detection value to the computer 80.

Figure 5:
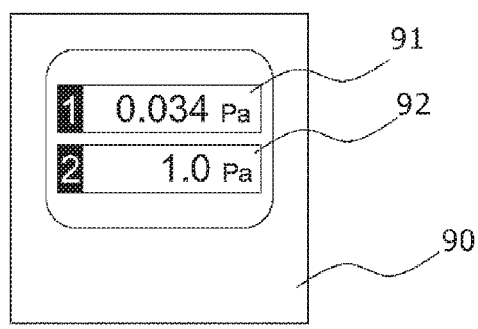
FIG. 5 is a schematic block diagram showing a pressure display section 90 according to the embodiment of the present invention.

FIG. 5 is a schematic block diagram showing the pressure display section 90 according to the embodiment of the present invention. The pressure display section 90 shown in this figure includes: a first display portion 91 for displaying the detection value of the vacuum gauge 77 disposed in the vicinity of the inlet of the turbo-molecular pump 88; and a second display portion 92 for displaying the detection value of the vacuum gauge 65 disposed in the sample holder 53. According to the illustrated example, a pressure at the inlet of the turbo-molecular pump 88 is 0.034 [Pa], while a pressure in the vicinity of the sample 70 is maintained at 1.0 [Pa].

Returning to FIG. 3, the gas inlet device 60 is for emission of a gas onto the sample 70 which is irradiated with the electron beam generated by the electron gun 1. The gas inlet device 60 includes: a gas nozzle 61 connected to a gas cylinder (not shown) and having an injection port 63 open into the sample holder 53 and disposed at a distal end thereof; and a regulator valve 62 for regulating the amount of gas emitted from the injection port 63. The injection port 63 is directed to the heater 64 so that the gas is emitted from the injection port 63 onto the sample 70 on the wire of the heater 64. The regulator valve 62 is a solenoid valve. The opening of the regulator valve 62 is controlled based on a control signal outputted from the gas control unit 81.

The gas control unit 81 is for controlling the amount of gas introduced (emitted) by the gas inlet device 60 so as to ensure that the degree of vacuum in the third intermediate chamber 74 provided with the secondary electron detector 51 is continuously maintained at less than a set value P1 during the gas introduction by the gas inlet device 60. The gas control unit 81 is installed in the computer 80. The gas control unit 81 is supplied with an output from the vacuum gauge 65. Based on the degree of vacuum inputted from the vacuum gauge 65, the gas control unit 81 regulates the amount of gas introduced (emitted) into the sample holder 53. Specifically, when the pressure value inputted from the vacuum gauge 65 is less than the set value P1, the gas control unit 81 maintains the regulator valve 62 at a predetermined opening. When the pressure value inputted from the vacuum gauge 65 is equal to or more than the set value P1, the gas control unit 81 closes the regulator valve 62 so as to disable the gas inlet device 60 for the gas emission to the sample 70.

The set value P1 related to the control of the amount of introduced gas is decided based on the value of voltage (extraction voltage) applied to the secondary electron detector 51 and the type of gas introduced by the gas inlet device 60. The set value P1 is so defined as not to induce electric discharge at the application of the extraction voltage to the secondary electron detector 51.

Figure 6:
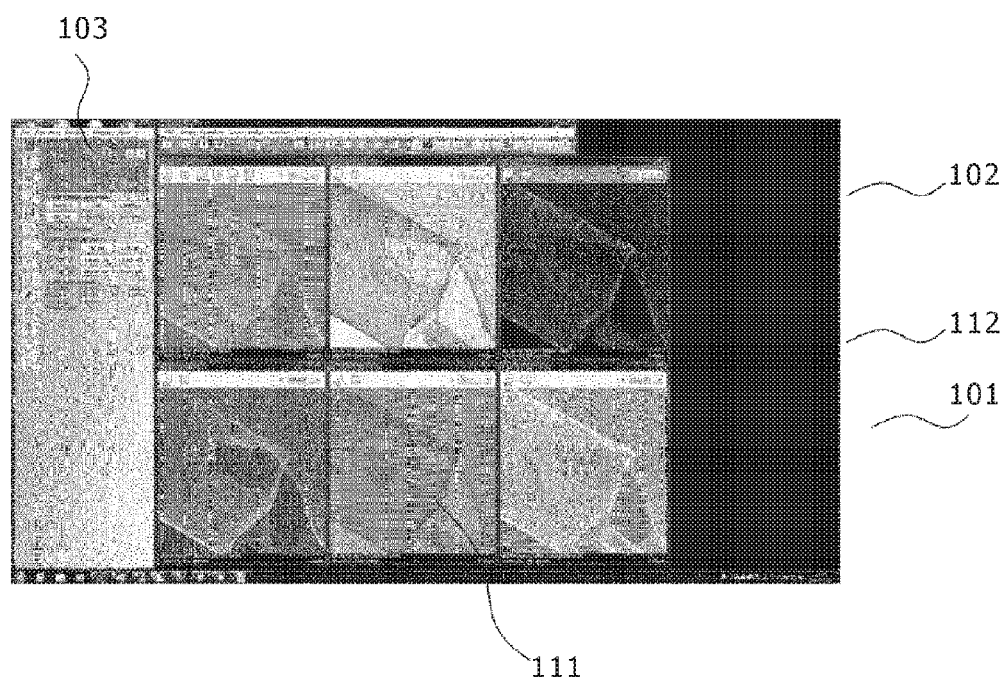
FIG. 6 is a photographic image showing an example of a display screen of a monitor 39 according to the embodiment of the present invention.
Figure 7:
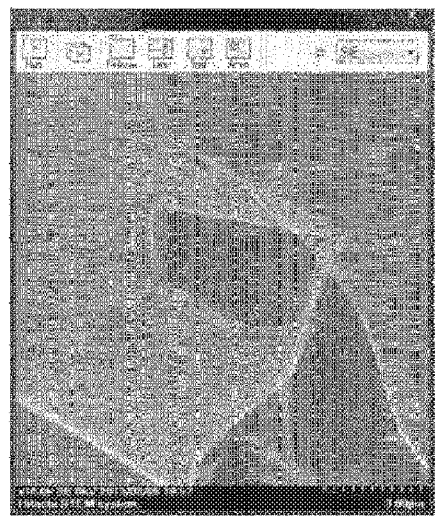
FIG. 7 is a microscopic image showing an example of a recorded moving image.

FIG. 6 is a photographic image showing an example of a display screen of the monitor 39 according to the embodiment of the present invention. The screen shown in this figure includes: an image display section 101 displaying electron microscopic images 111, 112; an image controller 102 for controlling the images 111, 112 displayed on the image display section 101; and a main. controller 103 principally used for operation of the electron microscope.

The image display section 101 displays one or more electron microscopic images on a per window basis. The number of windows displayed on the image display section 101 can be varied freely via the main controller 103. According to the example shown in FIG. 9, two windows (images) 111, 112 are displayed.

Figure 10:
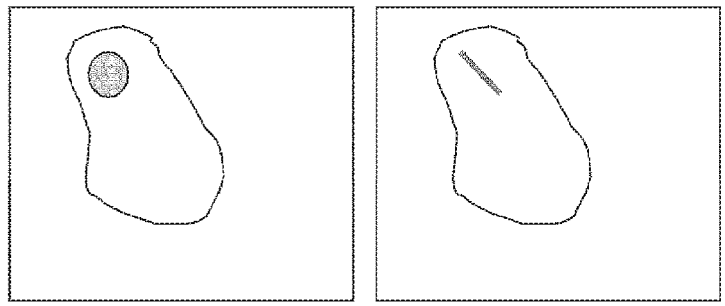
FIG. 10 is a set of images showing an example of tracing by a trace function according to the present invention.

The image controller 102 permits the control of the image related to either one of the windows 111, 112 on the image display section 101 that is selected by means of a mouse 57 or the like (hereinafter, sometimes referred to as "selected window") FIG. 10 is an enlarged view showing the image controller 102. As shown in the figure, the image controller 102 includes: a single-image button 121; a secondary electron image button 122; a bright field image button 123; a dark field image button 124; a reflection electron image button 125; a color button 126; a superposition button 131; an upper image pulldown menu 132; a lower image pulldown menu 133; a color button 134; a color button 135; a transmittance input portion 136; a clock time button 141; a vacuum degree button 142; a sample temperature button 143; a time button 144; and a record button 151. In the example shown in FIG. 10, a selected button is represented by black fill button while a non-selected button is represented by an outline button.

When the secondary electron image button 122 is pressed after selection of one of the windows 111, 112 in the image display section 101, a secondary electron image detected by the secondary electron detector 51 at the time is displayed in the selected window as a real-time moving image. Similarly, pressing the bright field image button 123 effects the display of a bright field image in the selected window, pressing the dark field image button 124 effects the display of a dark field image in the selected window, or pressing the reflection electron image button 125 effects the display of a reflection electron image in the selected window. Only one of these buttons 122, 123, 124, 125 can be pressed at a time. Pressing any one of these buttons other than the selected button cancels the previously selected button. Thus, the image in the selected window can be switched to another. Since the embodiment is adapted for real-time display of the secondary electron image, the bright field image, the dark field image and the reflection electron image one after the other as desired by an operator, the operator can easily grasp the migration of the particles relevant to the sample 70, for example.

Pressing the color button 126 changes the image displayed in the selected window from gray scale display to pseudo color display. The term "pseudo color display" used herein means, for example, display of a gradation image of one chromatic color such as green in place of a black-and-white gradation image. The color button 126 can be selected in combination with any of the other buttons 122, 123, 124, 125. Re-pressing the color button 126 cancels the color display, returning the displayed image to the gray scale image.

When the clock time button 144 is pressed after selection of either one of the windows 111, 112 in the image display section 101, an imaging time of the relevant image is displayed on the image in the selected window. When the vacuum degree button 142 is pressed, a degree of vacuum (pressure) measured by the vacuum gauge 65 at the imaging time of the relevant image is displayed on the image in the selected window. When the sample temperature button 143 is pressed, a sample temperature related to the imaging time of the relevant image is displayed on the image in the selected window. When the time button 144 is pressed, the time elapsed from the beginning of the observation of the sample 70 to the imaging time of the relevant image is displayed on the image in the selected window. The start time of the observation of the sample 70 is specified by the operator via the main controller 103.

While the illustrated example displays the clock time, degree of vacuum, sample temperature and time on the image in the window, these parameters may also be displayed at another area of the screen. Further, it goes without saying that any information other than the clock time, degree of vacuum, sample temperature and time that is relevant to the image (such as the total amount of energy applied by the heater 64 to the sample 70 during the observation, acceleration voltage as an observation condition of the electron microscope, magnification ratio, and scale bar) can be displayed.

The record button 151 is for saving (recording) the image (moving image) displayed in the selected window in a storage device (such as HDD or ROM) in the computer 80. When the record button 151 is pressed, a record start signal is supplied to the record control unit 95 so that the recording of the moving image in the selected window is started. On the other hand, when the record button 151 is pressed again, a record stop signal is supplied to the record control unit 95 so as to end the recording. While the embodiment is configured to start recording by pressing the record button 151, the record control unit 95 may also be configured to automatically record all the moving images taken by the individual detectors 51, 55, 49, 59 during the operation of the electron microscope. Further, the image display section 101 may also be configured to display the recorded moving images after the end of the observation. The display of the recorded moving images in this case can also be handled via the image display section 101 and the image controller 102.

Figure 11:
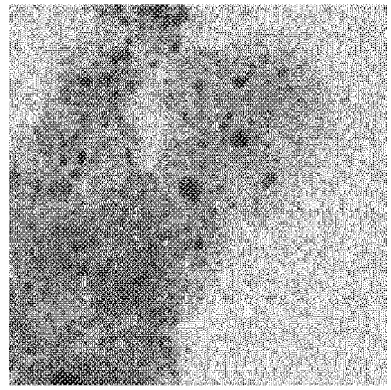
FIG. 11 a set of microscopic images showing an example of performing the trace function according to the present invention.
Figure 11:
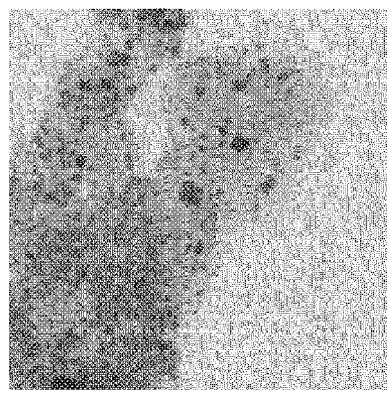
Figure 11:
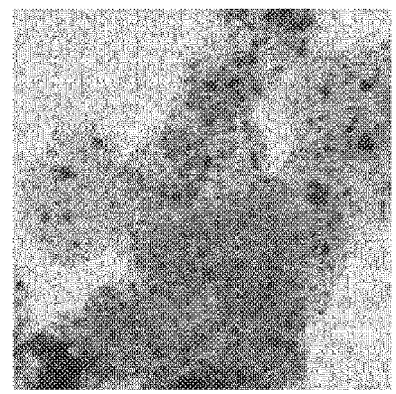

FIG. 11 is a set of microscopic images showing an example of the image display section 101 where the secondary electron image is displayed in the window 111 and the bright field image is displayed in the window 112. The images displayed in the windows 111, 112 are synchronized and generated based on outputs of detections obtained by the detectors 51, 55, 49, 50 at the same clock time. In the example shown in the figure, the vacuum degree button 142, the sample temperature button 143 and the time button 144 are pressed for each of the windows 111, 112 so that the degree of vacuum, sample temperature and time are displayed on the image in the respective windows 111, 112. In situ observation of the sample 70 by utilizing the secondary electron image enables three dimensional observation of the change in the sample. For example, it is possible to observe how, out of the particles relevant to the sample 70, those on the surface of the sample 70 migrate from the surface to the inside of the sample.

If the secondary electron image and the bright field image are arranged in juxtaposition and displayed at a time, as shown in FIG. 6, the surface and the inside of the sample 70 can be observed simultaneously. This is advantageous in that the migration of the particles from the surface of the sample 70 to the inside thereof can be readily confirmed if it is determined that the particles present on the surface of the sample 70 at a certain time disappear from the secondary electron image subsequently but still exist in the bright field image.

Figure 12:
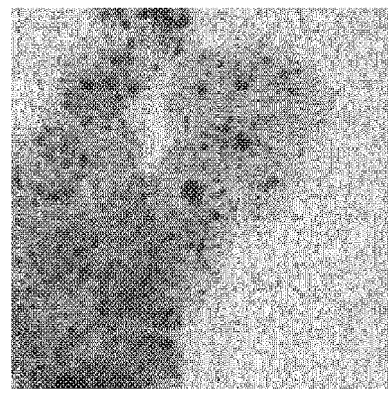
FIG. 12 is a set of microscopic images showing an example of performing an area, perimeter measurement function according to the present invention.
Figure 12:
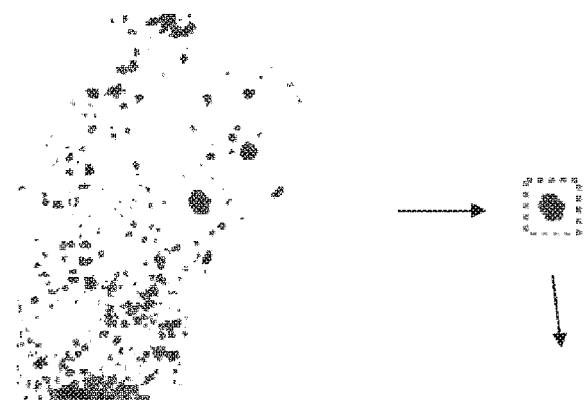

FIG. 12 is a set of images showing an example where the image display section 101 displays six windows 111, 112, 113 at a time. In the example shown in this figure, the added window 113 displays a dark field image. Such a simultaneous display of the secondary electron image, bright field image and dark field image detected at the same time enables a simultaneous observation of the surface, the inside and the back side of the sample 70. For example, it is easy to determine at which of the surface, the inside and the back side of the sample 70 the particles exist. It is noted that the image display section 101 may also display a reflection electron image by adding a window or by replacing any one of the above images. The reflection electron image includes an image of the surface and an image of the inside of the sample and hence, an image composed of the secondary electron image and the dark field image can be obtained.

Figure 9:
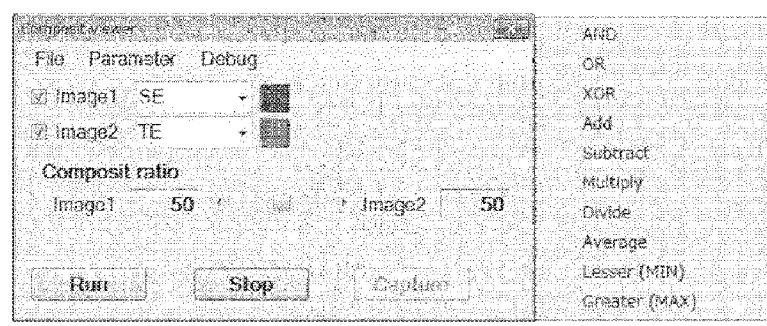
FIG. 9 is an image showing an example of an image display section 101 displaying a secondary electron image in a window 111 and a bright field image in a window 112, or an example of the display screen of the monitor 39 according to the embodiment of the present invention.

FIG. 9 is an image showing an example where one window is switched to any one of the plural types of images as needed. The selection of the image to be displayed on the selected window (image switching) is accomplished by pressing the secondary electron image button 122, the bright field image button 123, the dark field image button 124 or the reflection electron image button 125. Thus, any one of the secondary electron image, bright field image, dark field image and reflection electron image, which are taken at the same clock time, can be displayed on the selected window. According to the illustrated example, the window is switched from the secondary electron image to the dark field image before gas introduction and the window is switched form the secondary electron image to the dark field image after the gas introduction. The particle migration related to the sample 70, for example, can be visually and readily grasped by switching the image from one type to another on a real-time basis during the observation.

Returning to FIG. 9, when the superposition button 131 is pressed after the selection of either one of the windows 111, 112 in the image display section 101, any two of the secondary electron image, the bright field image, the dark field image and the reflection electron image can be superposed and displayed in the selected window.

Figure 8:
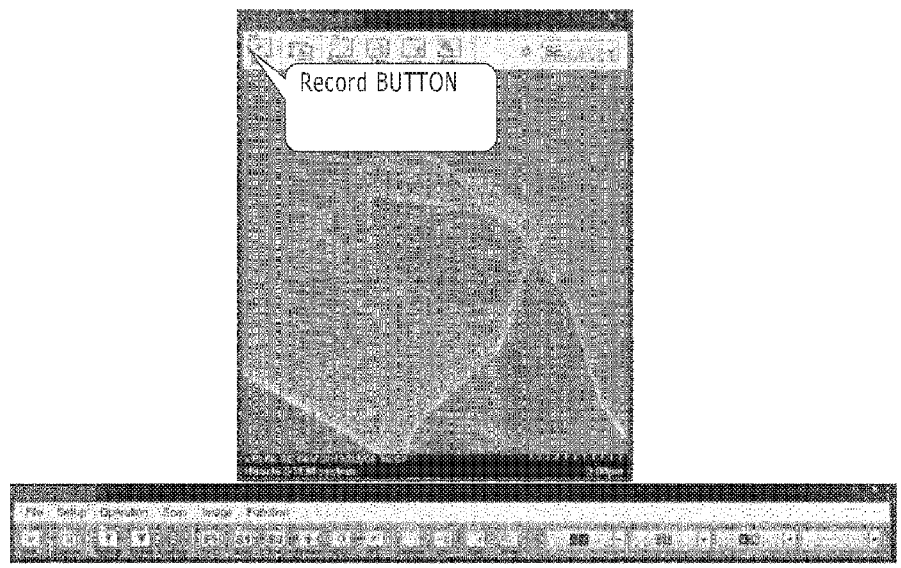
FIG. 8 is an image showing an example of the display screen. of the monitor 39 according to the embodiment of the present invention.

The upper image pulldown menu 132 is for selecting from the secondary electron image, the bright field image, the dark field image and the reflection electron image, an image to be displayed on top of the other image in a window for which the superposition button 131 is pressed. According to the example shown in FIG. 8, the secondary electron image is selected. The lower image pulldown menu 133 is for selecting from the secondary electron image, the bright field image, the dark field image and the reflection electron image, an image to be displayed under the other image in a window for which the superposition button 131 is pressed. According to the example shown in FIG. 10, the dark field image is selected. The single-image button 121 is used for returning the selected window from a superposition display to a single-image display when the superposition display is set for the selected window by the superposition button 131. An image to be displayed in the selected window returned to the single-image display is decided based on a button pressed at the time of return to the single-image display (the secondary electron image button 122, bright field image button 123, dark field image button 124, reflection electron image button 125, and color button 126).

FIG. 10 relates to a function to trace particles involved in reaction or a function to display a migration trajectory of the particles. FIG. 11 shows a tracing example. The trace is performed by identifying the particles using normalized correlation, followed by template image search based on template image matching. An example of template image search is described as below. A correlation calculation represented by an equation (1) is performed on the all pixels in a designated region of a source image so as to detect a maximum value point (1.0) of matching degree factor (r) as a displacement. It is noted herein that the matching degree is defined as r multiplied by 100.

[Equation 1]

$$r^2 = \frac{\{n\sum fg - \sum f \sum g\}^2}{\{n\sum f^2 - (\sum f)^2\}\{n\sum g^2 - (\sum g)^2\}} \quad (1)$$

where 'f' denotes a source image, 'g' denotes a template image, and 'n' denotes valid pixels in template region ($1<n<:=65536$: 256×256 equivalent).

With this method, the equation for calculating the correlation coefficient per se normalizes data and hence, provides a higher matching degree against brightness variation or blurring. These calculations are performed on one region of the source image that corresponds to a region of the template image. The normalized correlation search according to the present invention includes three steps of setup, training and search. The setup step is to cut out a template image from an input image. The training step is to register the cutout image as a template image for the normalized correlation search. The search step is to search the template registered in the training step. The displacement is obtained by calculating a displacement position with sub-pixel precision.

FIG. 12 shows an example of measuring the area or perimeter of the particles. The area and perimeter may be determined by two-step approximation process as shown in the figure.

Figure 13:
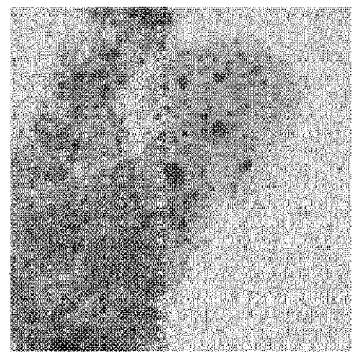
FIG. 13 is a set of microscopic images showing an example of performing field alignment according to the present invention.
Figure 13:
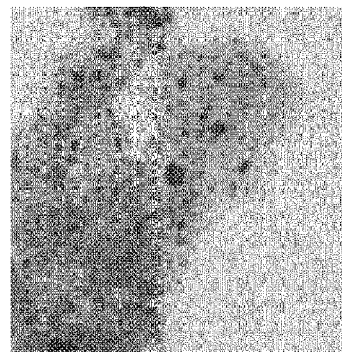
Figure 13:
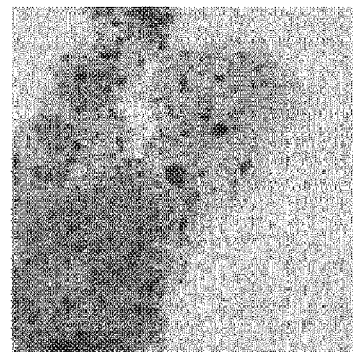

FIG. 13 shows an example of field alignment. The field position is aligned by correcting the particle displacement used in the trace function by way of a stage and image shift.

Figure 14:
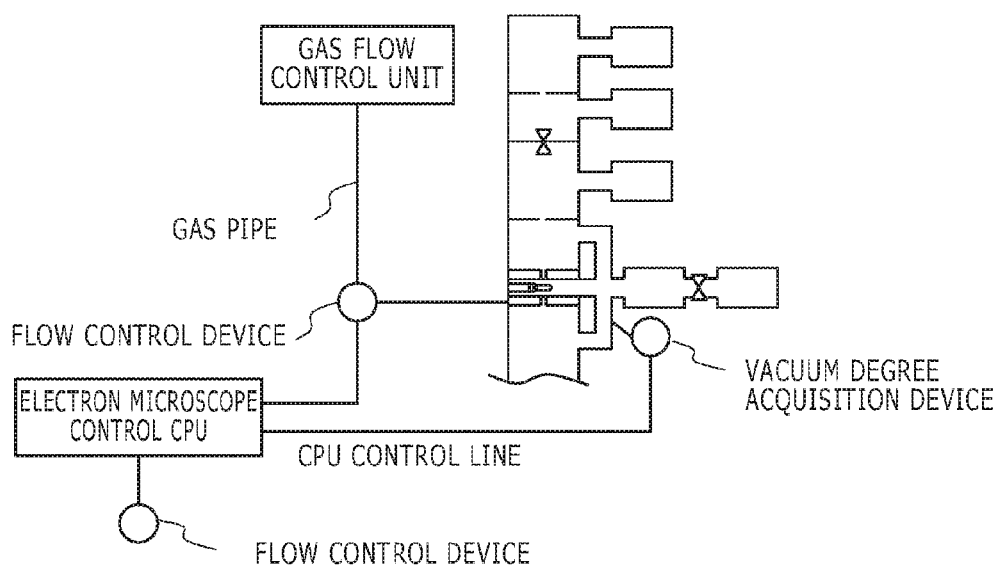
FIG. 14 is a control block diagram showing an example of gas control according to the present invention.
Figure 15:
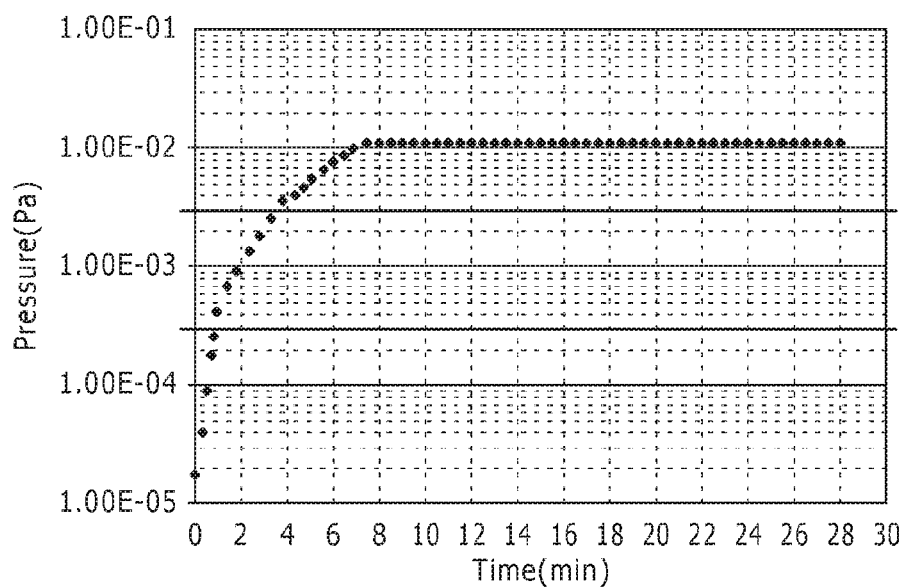
FIG. 15 is a graph showing an example of gas introduction control according to the present invention.

FIG. 14 shows a control block diagram of the present invention, while a control example is shown in FIG. 15 where the abscissa represents time and the ordinates represents vacuum degree. The vacuum is controlled by raising the vacuum degree in a predetermined time so that the reaction is controlled to reduce the migration in the sample.

Figure 16:
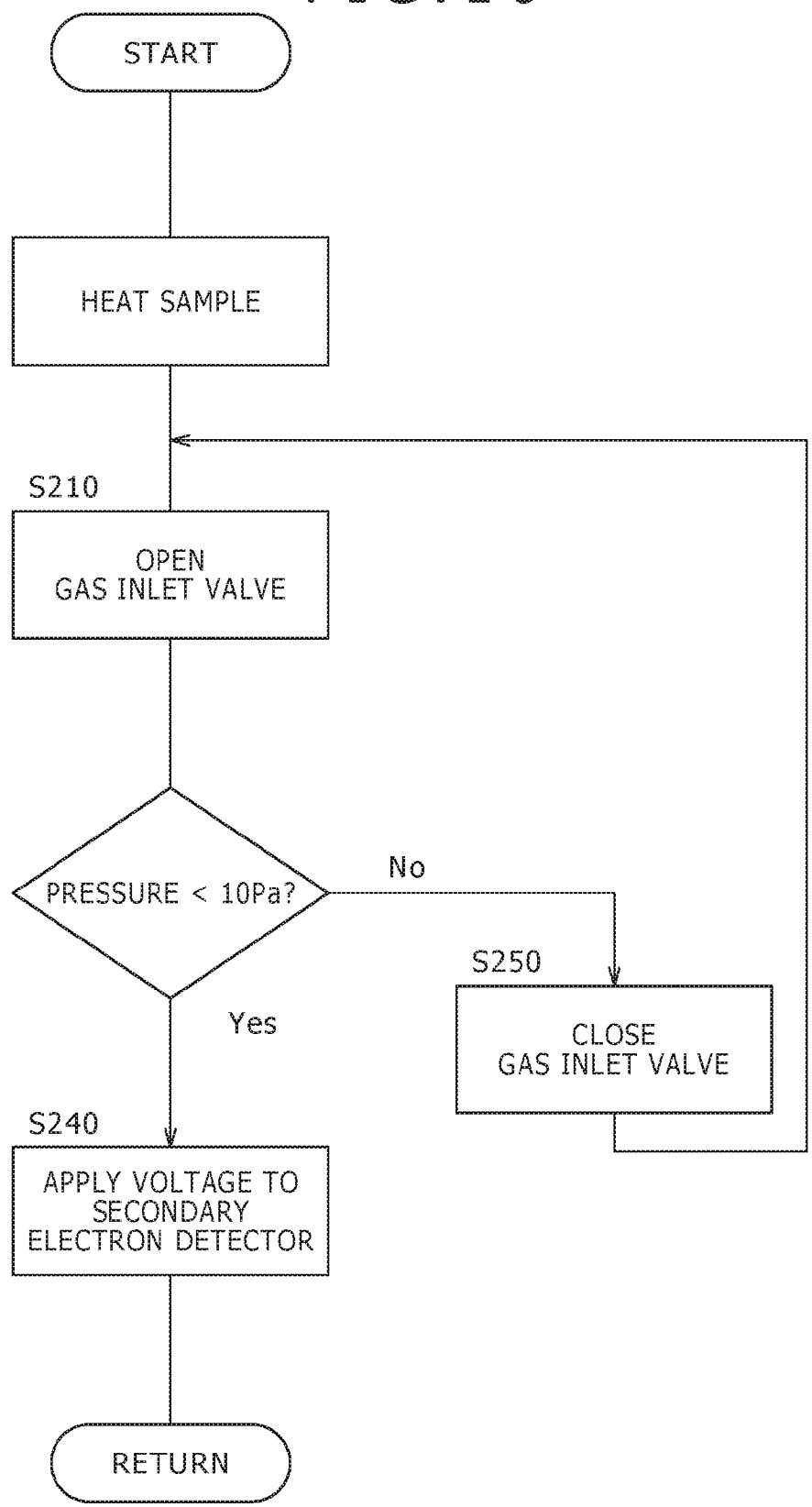
FIG. 16 is a flow chart showing the steps of gas introduction.

FIG. 16 illustrates a vacuum control method. The degree of vacuum in the vicinity of the sample can be controlled by opening or closing a gas inlet valve.

LIST OF REFERENCE SIGNS

1 . . . Electron gun
2 . . . First illumination lens coil
3 . . . Second illumination lens coil
4 . . . First polarization coil
5 . . . Second polarization coil
6 . . . Objective lens coil
7 . . . First electromagnetic sample image moving coil
8 . . . Second electromagnetic sample image moving coil
9 . . . First intermediate lens coil
10 . . . Second intermediate lens coil
11 . . . First projection lens coil
12 . . . Second projection lens coil
13 to 23 . . . Excitation power supply
24 to 34 . . . DAC
35 . . . Microprocessor
36 . . . Storage device
37 . . . Arithmetic device
38 . . . Monitor controller
39 . . . Monitor
40 to 41 . . . I/F
42 . . . Magnification switching rotary encoder
43 . . . Input rotary encoder
44 . . . Keyboard
45 . . . RAM
46 . . . ROM
47 . . . Scanned image capture interface
48 . . . Image capture interface
49 . . . Bright field image detector
50 . . . Dark field image detector
51 . . . Secondary electron detector
52 . . . X-ray detector
53 . . . Sample stage
54 . . . CL detector
55 . . . Reflection electron detector
59 . . . Heater
60 . . . Gas inlet device
62 . . . Regulator valve
63 . . . Injection port
64 . . . Heater
65 . . . Vacuum gauge
70 . . . Sample
77 . . . Vacuum gauge
81 . . . Gas control unit
82 . . . Detector control unit
83 . . . Heater control unit
90 . . . Pressure display section
95 . . . Record control unit
101 . . . Image display section

The invention claimed is:

1. An electron microscope that includes an electron source for irradiation of a sample with an electron beam; and a detector for detecting an electron generated from the sample by irradiation with the electron beam, and generates an image of the sample based on an output from the detector, the electron microscope comprising:

a gas inlet portion for introducing a gas to the sample;
a display section for displaying the generated image; and
a control unit for controlling the gas inlet portion,
wherein a plurality of the detectors are provided,
the display section simultaneously saves and plays back, as a plurality of moving images, a plurality of images generated based on outputs from the plural detectors, and
an arbitrary shape on the moving image is specified so as to trace the shape by image correlation and a movement trajectory of the shape is displayed.

2. The electron microscope according to claim 1, wherein a drift-free image is displayed on the moving image by specifying an arbitrary shape on the moving image so as to trace the shape in a moving image file by image correlation, and fixing the field to the traced position.

3. An electron microscope that includes an electron source for irradiation of a sample with an electron beam; and a detector for detecting an electron generated from the sample by irradiation with the electron beam, and generates an image of the sample based on an output from the detector, the electron microscope comprising:

a gas inlet portion for introducing a gas to the sample;
a display section for displaying the generated image; and
a control unit for controlling the gas inlet portion,
wherein a plurality of the detectors are provided,
the display section simultaneously displays a plurality of images generated based on outputs from the plural detectors, and
an arbitrary shape on the image is specified so as to trace the shape by image correlation and a movement trajectory of the shape is displayed.

4. The electron microscope according to claim 3, further comprising a field moving device for electromagnetically or mechanically moving the field,
wherein a drift-free image is displayed by specifying an arbitrary shape on the image so as to trace the shape on the displayed images by image correlation, and moving the field to a specified position by means of the field moving device.

5. The electron microscope according to claim 3, wherein the movement of a feature point in the image is detected so as to extract a traced shape in each field, and the area and perimeter of the extracted shape are measured.

* * * * *